United States Patent [19]

Zaderej

[11] 4,216,443
[45] Aug. 5, 1980

[54] TRANSISTOR RESONANT CIRCUIT POWER OSCILLATORS

[75] Inventor: Andrew Zaderej, South Bend, Ind.

[73] Assignee: Unitron Corporation, Elkhart, Ind.

[21] Appl. No.: 8,778

[22] Filed: Feb. 2, 1979

Related U.S. Application Data

[63] Continuation of Ser. No. 879,434, Feb. 21, 1978, abandoned, which is a continuation of Ser. No. 791,283, Apr. 27, 1977, abandoned.

[51] Int. Cl.² ............................................. H03B 5/12
[52] U.S. Cl. .............................. 331/115; 331/116 FE; 331/117 FE
[58] Field of Search ............. 331/115, 117 R, 117 FE; 307/304

[56] References Cited

U.S. PATENT DOCUMENTS 3,130,378  4/1964  Cook, Jr. ........................ 331/115 X

OTHER PUBLICATIONS

Stanley et al., "Two-Terminal Negative Dynamic Resistance," Electronics Letters, 8 Jan. 1970, vol. 6, No. 1, pp. 1, 2.
Hodowanec, "Complementary JFETS form Bimode Oscillator", Electronics, Oct. 30, 1975, p. 99.
Electronic Design, "Field-Effect Transistors," Apr. 26, 1963, pp. 66–69.
Electronic Design, "Combining FETS for Higher Gains," Sep. 27, 1963, pp. 36–41.

Primary Examiner—Siegfried H. Grimm
Attorney, Agent, or Firm—Oltsch, Knoblock & Hall

[57] ABSTRACT

A power oscillator utilizing one or more field effect transistors in conjunction with a tank circuit.

2 Claims, 7 Drawing Figures

A.C. LINE

TO D.C. POWER CIRCUIT ved in the 13 to 15 MHz range.
TRANSISTOR RESONANT CIRCUIT POWER OSCILLATORS

CROSS REFERENCE TO RELATED APPLICATION

This is a continuation of application Ser. No. 879,434, filed Feb. 21, 1978 which is a continuation of application Ser. No. 791,283, filed Apr. 27, 1977, both being now abandoned.

SUMMARY OF THE INVENTION

This invention relates to a power oscillator and has particular application to a miniaturized high power driving oscillator.

The oscillator of this invention includes a tank circuit to which a junction field effect transistor is connected in series. Means are complementally coupled to the field effect transistor for producing in association with the transistor a negative resistance effect with a lambda-shaped current-voltage (I-E) output which said tank circuit converts into a specific resonant frequency. In other applications of this invention a tank coil, junction field effect transistor, and crystal are connected in series, with the field effect transistor serving as an amplifier between the crystal and tank coil.

Through the use of junction field effect transistors a high power driving oscillator producing a sinusoidal wave form with low harmonic distortion, high frequency and very high efficiency is obtainable. By utilizing one or more junction field effect transistors to produce a negative resistance effect having a lambda-shaped current-voltage output, a miniaturized power oscillator having a 25 watt output in the 13 to 15 MHz range has been developed.

Accordingly, it is an object of this invention to provide a power oscillator in miniaturized form which is of very high efficiency and high frequency with low harmonic distortion.

Another object of this invention is to provide a power oscillator in miniaturized form for a 25 watt output in the 13 to 15 MHz range.

Still another object of this invention is to produce a miniaturized power oscillator utilizing a negative resistance effect.

Other objects of this invention will become apparent upon a reading of the invention's description.

DESCRIPTION OF THE PREFERRED EMBODIMENTS

The preferred embodiments illustrated are not intended to be exhaustive or to limit the invention to the precise forms disclosed. They are chosen and described in order to best explain the principles of the invention and its application and practical use to thereby enable others skilled in the art to best utilize the invention.

Figure 1:
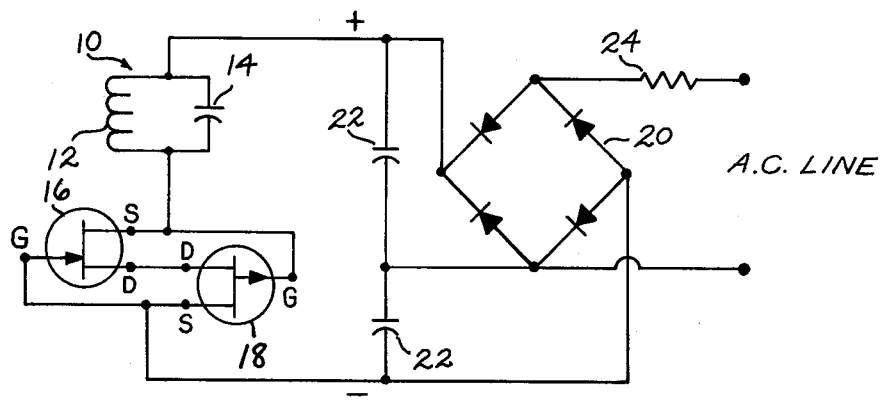
FIG. 1 is a circuit diagram of one embodiment of this invention shown connected to a power supply circuit.

In the diagram shown in FIG. 1, the oscillator includes a tank circuit 10 which is of a parallel AC resonating network consisting of a coil 12 and capacitor 14. Connected to tank circuit 10 and forming a part of the oscillator is an N-channel junction field effect transistor 16 and a P-channel junction field effect transistor 18. The drain of transistor 16 is connected to the drain of transistor 18, with the source of transistor 16 connected to the gate of transistor 18 and the source of transistor 18 connected to the gate of transistor 16. Tank circuit 10 is joined to transistors 16 and 18 at the connection between the source of transistor 16 and the gate of transistor 18.

The DC power for the above described oscillator may be derived from any number of sources. A circuit for a 115–120 V, 60 Hz AC household power source is illustrated in FIG. 1 in which a bridge-voltage doubling circuit is utilized to convert the relative high voltage and alternating current to a suitable usable DC voltage. A diode bridge 20 is shown connected to capacitors 22 in a manner well known in the art. A resistor 24 is placed in line with the AC power source for the purpose of dropping the voltage to bridge 20. Coupled field effect transistors 16 and 18 produce a lambda-shaped current-voltage curve output which is converted by the tank circuit into a sinusoidal, low harmonic distortive wave form of high frequency and very high efficiency. It is contemplated that by selecting suitably valued components for the combination oscillator and power source circuits shown in FIG. 1, a household current of 115–120 V, 60 Hz can produce at tank circuit 10 a 25 watt output at 13 to 15 MHz.

Figure 2:
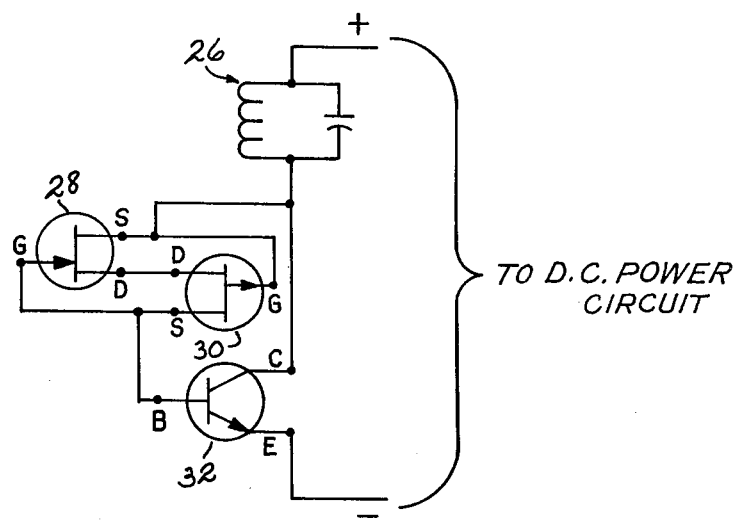
FIG. 2 is a circuit diagram of a second embodiment of this invention.

The oscillator shown in FIG. 2 includes a tank circuit 26 which is series connected to a drain to drain connected N-channel junction field effect transistor 28 and a P-channel junction field effect transistor 30. An NPN bi-pole transistor 32 is coupled to transistors 28 and 30. The base of transistor 32 is joined to the connection between the source of transistor 30 and the gate of transistor 28, with the collector of the transistor 32 being joined to tank circuit 10 at the connection between the source of transistor 28 and the gate of transistor 30. NPN transistor 32 serves to amplify the coupled field effect transistors 28 and 30.

Figure 3:
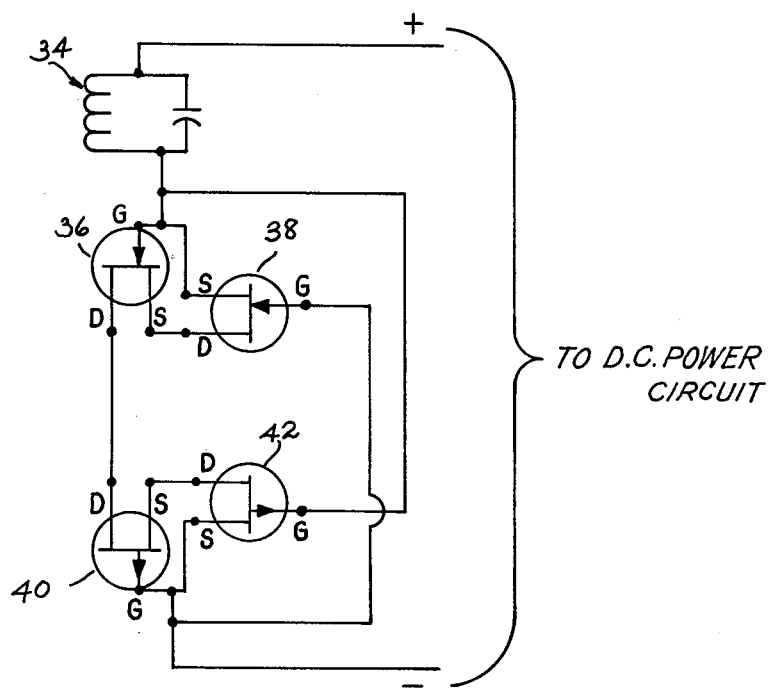
FIG. 3 is a circuit diagram of another embodiment of this invention.

The oscillator shown in FIG. 3 includes tank circuit 34 which is series connected to four coupled junction field effect transistors 36, 38, 40, 42. Transistors 36 and 38 are two N-channel junction field effect transistors connected in series and transistors 40 and 42 are two P-channel junction field effect transistors connected in series. The drain of transistor 36 is connected to the drain of transistor 40. The gate of transistor 38 is joined to the connection between the gate of transistor 40 and the source of transistor 42. The gate of transistor 42 is joined to the connected between the gate of transistor 36 and the source of transistor 38. The series connection between each of transistors 36 and 38 and transistors 40 and 42 serves to double the breakdown voltage for tank circuit 34.

Figure 4:
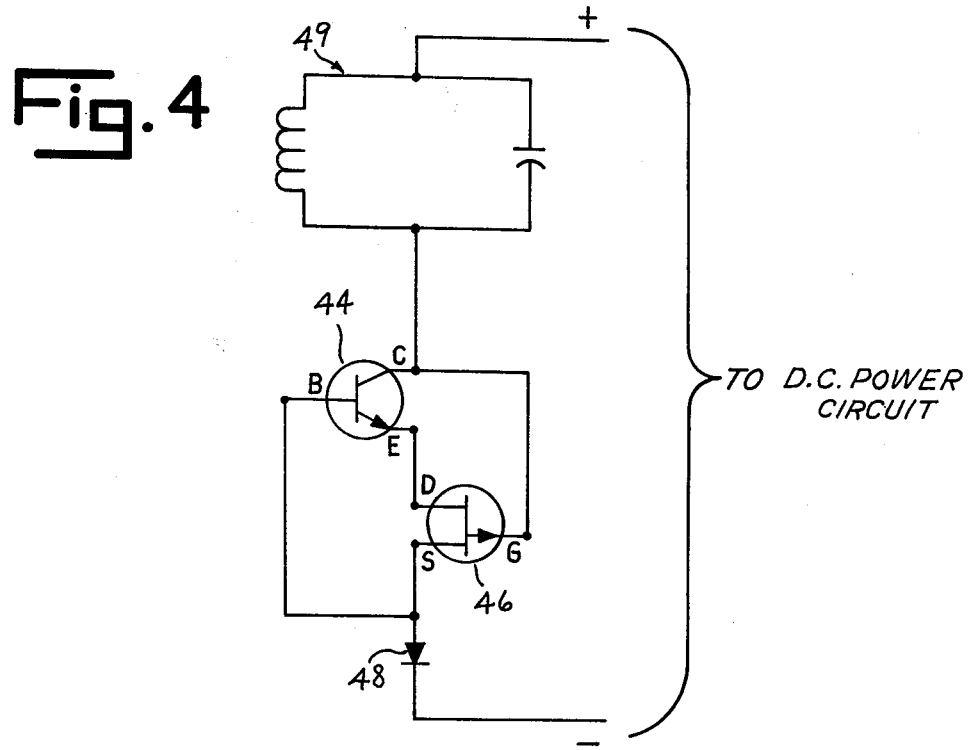
FIG. 4 is a circuit diagram of yet another embodiment of this invention.

In the oscillator illustrated in FIG. 4 an NPN bi-pole transistor 44 is coupled to a P-channel junction field effect transistor 46. The base of transistor 44 is connected to the source of transistor 46 and the gate of transistor 46 is connected to the collector of transistor 44. The emitter of transistor 44 is connected to the drain of transistor 46. Diode 48 is joined at one of its junctions with its polarity in a respective mode to the connection between the base of transistor 44 and the source of transistor 46 with its remaining junction connected in series with the power circuit so as to bias the base-emitter junction of transistor 44. In this manner, NPN transistor 44 and field effect transistor 46 in conjunction with diode 48 form a self-bias negative resistance with feedback for tank circuit 49.

The oscillator of FIG. 4 could be modified by substituting an N-channel junction field effect transistor for transistor 46 and a PNP bi-pole transistor for transistor 44, with diode 48 being reverse oriented. When using a PNP transistor coupled to an N-channel field effect transistor there will be like connections between the emitter to drain, base to source, and collector to gate of the respective PNP and N-channel transistors as described for the embodiment shown in FIG. 4.

Figure 5:
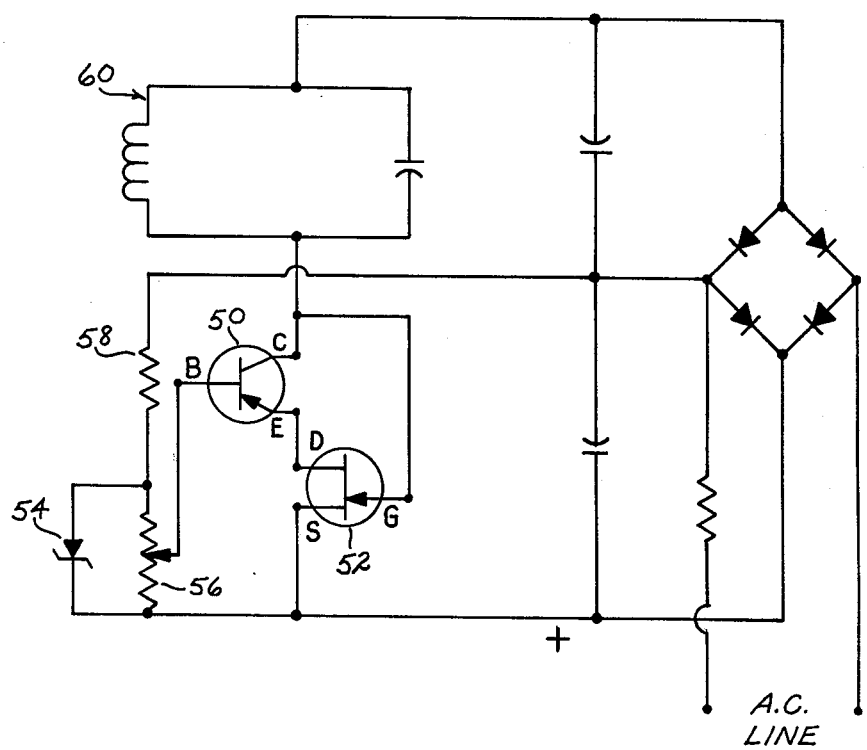
FIG. 5 is a circuit diagram of another embodiment of this invention shown with its power circuit.

In the oscillator shown in FIG. 5, a PNP bi-pole transistor 50 is coupled to an N-channel junction field effect transistor 52 as shown. The bias for transistor 50 is provided by a zener diode 54 and a parallel connected adjustable resistor 56. The base of PNP transistor 50 is connected to resistor 56 with the resistor and diode 54 connected directly into the power source circuit for the oscillator. A resistor 58 is connected in series with diode 54 to reduce the voltage across the diode. The adjustability of resistor 56 provides an adjustable bias for transistor 50 to obtain the desired lambda-shaped current-voltage output for corrected tank circuit 60.

Figure 6:
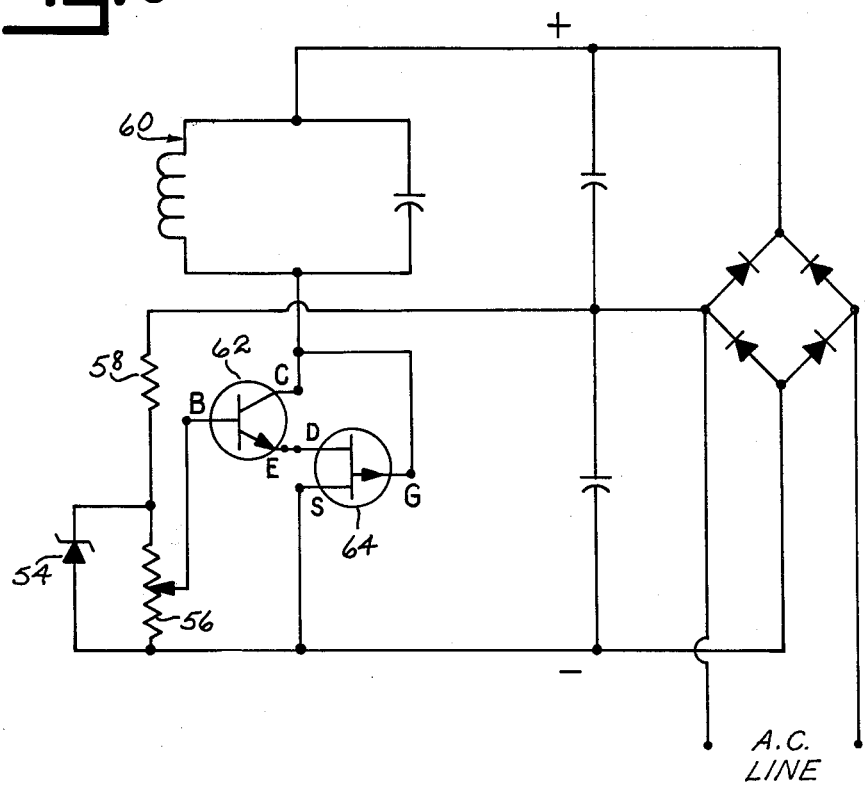
FIG. 6 is another embodiment of this invention shown with its power circuit.

The oscillator shown in FIG. 6 is similar to that of FIG. 5, with the exception that an NPN bi-pole transistor 62 is substituted for transistor 50 and a P-channel junction field effect transistor 64 is substituted for N-channel transistor 52. Zener diode 54 is arranged with its polarity in a respective mode to accommodate this modified circuit.

Figure 7:
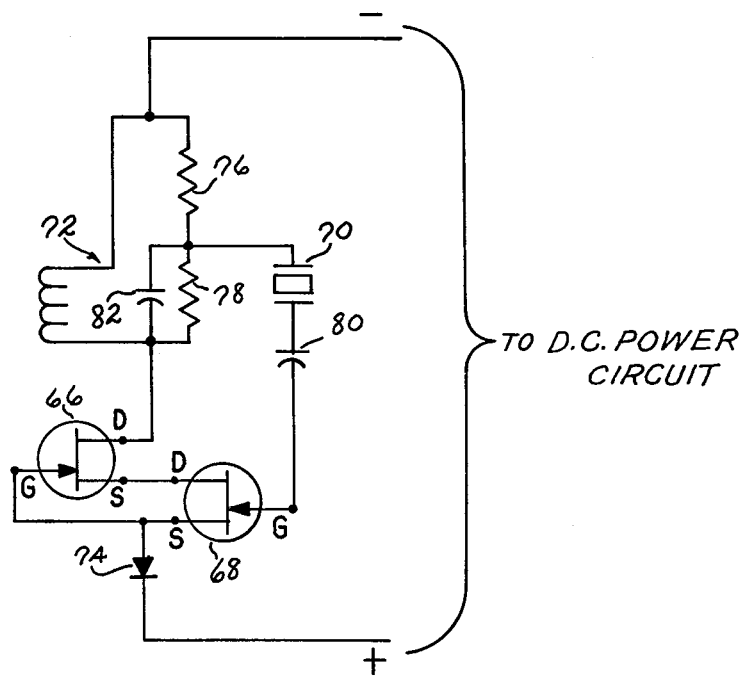
FIG. 7 is a circuit diagram of another embodiment of this invention.

In the above described oscillators shown in FIGS. 1–6, field effect transistors are utilized to produce a negative resistance having a lambda-shaped current-voltage curve output. In FIG. 7 an oscillator is depicted in which two series connected N-channel field effect transistors 66 and 68 act as an amplifier between a crystal 70 and a self-resonating tank coil 72. The source of transistor 66 is connected to the drain of transistor 68 and the gate of transistor 66 is connected to the source of transistor 68. The gate of transistor 68 is connected to one junction of crystal 70 with the drain of transistor 66 connected to tank coil 72. In this mode, as mentioned previously, the series connected N-channel field effect transistors 66 and 68 do not produce any negative resistance with resulting lambda-shaped current-voltage output, but, instead, act strictly as an amplifier for the wave generating crystal 70 which causes self-resonation in coil 72. Diode 74 serves as a bias for transistors 66 and 68. Resistors 76 and 78 act as voltage dividers for crystal 70. Capacitor 80 is a coupling capacitor, while capacitor 82 serves as a decoupling capacitor. Depending upon the power of transistors 66 and 68, in some embodiments of this particular oscillator it may be necessary only to utilize one such transistor instead of two in series as shown.

It is to be understood that the invention is not to be limited to the details above given, but may be modified within the scope of the appended claims.

What I claim is:

1. A power oscillator comprising a junction field effect transistor of the N-channel type, a bi-pole transistor of the PNP type, tank circuit means for producing a resonant frequency, and bi-pole transistor having its emitter connected to the drain of said field effect transistor and its collector connected to said tank circuit means, said field effect transistor having its gate connected to the collector of said bi-pole transistor, said bi-pole transistor having its base functionally connected to the source of said field effect transistor, diode means for biasing said bi-pole transistor base, said tank circuit means adapted for connection to a power source at its negative part, the source of said field effect transistor adapted for connection to the positive part of said power source, said bi-pole transistor and field effect transistor producing in combination a negative resistance effect with lambda-shaped current-voltage output characteristic, said diode means including a zener diode and resistor in parallel, means for connecting said zener diode and resistor to said power source independently of said field effect transistor and bi-pole transistor, the base of said bi-pole transistor being connected to said resistor.

2. A power oscillator comprising a junction field effect transistor, means complementally coupled to said field effect transistor for producing in association with the transistor a negative resistance effect with lambda-shaped current-voltage output characteristic, tank circuit means for producing a resonant frequency, said tank circuit means being connected in series with said field effect transistor, said tank circuit means including means for connection to the positive part of a power source, said field effect transistor including means for connection to the negative part of said power source, said coupled means being an NPN bi-pole transistor and said field effect transistor being a P-channel type, the emmitter of said NPN transistor being connected to the drain of said P-channel transistor, the collector of said NPN transistor being connected to the gate of said P-channel transistor, a zener diode and resistor in parallel, means connecting said zener diode and resistor to a power source independently of said P-channel transistor and NPN transistor, the base of said NPN transistor being connected to said resistor.

* * * * *